Feb. 13, 1962 W. W. KESTENBAUM 3,021,487

FREQUENCY MODULATION DISTORTION CANCELLATION SYSTEM

Filed Sept. 2, 1958

INVENTOR
WILLIAM W. KESTENBAUM
BY
[signature]
ATTORNEY

United States Patent Office 3,021,487
Patented Feb. 13, 1962

3,021,487

FREQUENCY MODULATION DISTORTION CANCELLATION SYSTEM

William W. Kestenbaum, Long Beach, N.Y., assignor to Sperry Rand Corporation, Great Neck, N.Y., a corporation of Delaware Filed Sept. 2, 1958, Ser. No. 758,217
6 Claims. (Cl. 328—162)

Figure 1:
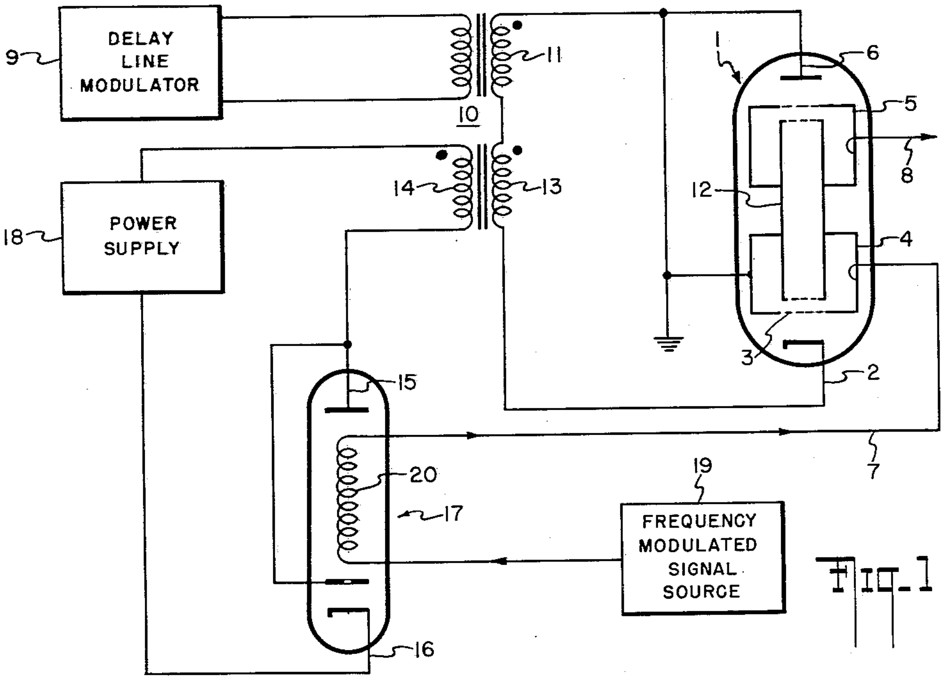

The present invention generally relates to frequency stabilization circuits and, more particularly, is concerned with circuit means for the elimination of undesirable frequency modulation distortion produced in a pulsed beam velocity modulation amplifier.

Electron beam velocity modulation devices such as, for example, klystrons and traveling wave amplifiers, are well known in the art for the amplification of microwave frequency signals. In the event that it is desired to gate such microwave signal amplifiers, experience has shown that upon the application of a gating or pulse modulating signal, undesirable frequency modulation effects are introduced into the microwave signal being amplified.

In the case of a klystron amplifier, for example, the pulse modulating signal may be applied across the anode and cathode of the klystron electron gun for purposes of gating the electron beam. In order that no undesirable frequency modulation by-products be created as a result of the application of the pulse modulating signal to the klystron electron gun, it is important that the pulse modulating signal be of constant amplitude. As a practical matter, however, it is difficult if not impossible to insure such constant amplitude of the pulse modulating signal when it is employed to gate a high power klystron amplifier on and off. In this case, the pulse modulating signal itself must be produced by a high power pulse modulating circuit such as, for example, a high power pulse delay line.

High power pulse delay lines are ordinarily comprised of a cascaded succession of lumped-constant delay line elements, the delay line being charged from a D.C. power source. The high power pulse is produced by the rapid discharge of the energy stored in the delay line. As a consequence of the physical structure of the delay line, the pulse formed upon discharge is not of constant amplitude but at best is of relatively constant average amplitude having a substantial alternating signal component superimposed on it.

The alternating signal component is of a frequency and amplitude dependent upon the number of lumped-constant elements comprising the delay line. Theoretical analysis indicates that the amplitude of the alternating signal component may be minimized by using an extended delay line consisting of a very great number of lumped-constant elements while the frequency of the alternating signal component may be minimized by the use of a very few of such elements. Neither alternative is an optimum one. The extended delay line is objectionable from a cost standpoint. The short delay line entails prohibitive loss in modulator efficiency.

Upon the application of a pulse modulating signal having a non-uniform amplitude to the klystron electron gun, the klystron beam velocity is varied. A change in velocity of the beam produces a change in phase in the output signal. Should the rate of change of beam velocity be other than zero, the rate of change in the phase of the output signal correspondingly is other than zero. As is well understood, a finite rate of change of phase is equivalent to a change in frequency. Thus, the klystron output signal is frequency modulated as a result of the application of the pulse modulating signal.

It is the general object of the present invention to suppress undesirable frequency modulation distortion produced in a beam velocity modulation amplifying device by the application of a pulse modulating signal.

Another object is to maintain substantially constant the electron beam velocity in a gated beam velocity modulation amplifying device irrespective of the non-uniformity in amplitude of the pulse modulating signal.

These and other objects of the present invention as will appear more fully from a reading of the following specification are achieved by the provision of first and second velocity modulation amplifying means. Provision is made for the gating on and off of the second amplifier in response to a pulse modulating signal containing undesirable alternating signal components giving rise to non-uniformity in the amplitude of the pulse signal. The first and second amplifiers are connected in cascade, the first amplifier being adapted to receive a desired input signal to be amplified. In a preferred embodiment, the first and second amplifiers may respectively comprise a traveling wave tube and a klystron. The pulse modulating signal is applied to the klystron.

Means are provided for the development of the undesired alternating signal components of the pulse modulating signal for application to the electron beam forming electrodes of the traveling wave tube. The undesired alternating signal component frequency modulates the desired signal passing through the traveling wave tube in substantially the same manner that the amplified desired signal, upon its later passage through the klystron, is also frequency modulated by the undesired alternating signal component of the pulse modulating signal. By properly phasing the alternating signal component which is applied to the traveling wave tube, the frequency modulation effects produced in the traveling wave tube and in the klystron tend to cancel one another.

Figure 2:
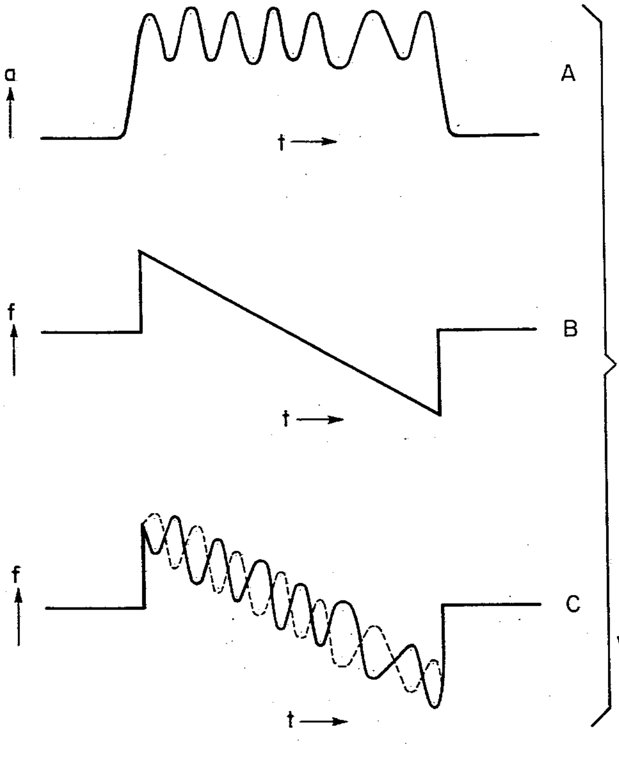

For a more complete understanding of the present invention, reference should be had to the following description and to the appended drawings of which:

FIG. 1 is a block diagram, partly schematic in form, of a preferred embodiment of the present invention; and FIG. 2 is a series of waveforms useful in explaining the operation of FIG. 1.

In FIG. 1, a double cavity klystron amplifier is generally designated by the numeral 1. Amplifier 1 comprises a cathode 2, anode 3, buncher resonator 4, drift tube 12, catcher resonator 5 and collector 6. An input signal appearing on line 7 is coupled into buncher resonator 4. The amplified output signal is coupled out of catcher resonator 5 and appears on line 8.

Delay line modulator 9, consisting of a plurality of lumped-constant delay line segments pulse modulates klystron 1 by means of four-winding transformer 10. The signal induced in secondary winding 11 is impressed across anode 3 and cathode 2 of klystron 1. As is common practice, collector 6 is returned to the same potential as anode 3.

Waveform A of FIG. 2 is illustrative of the wave shape of the pulse induced in secondary winding 11 of transformer 10. By inspection of waveform A, it will be seen that an alternating signal component is superimposed on the pulse. As previously explained, the alternating signal component results from the discharge of the lumped-constant elements comprising delay line modulator 9. The alternating signal component of waveform A, when impressed across anode 3 and cathode 2 of klystron 1, varies the velocity of the electron beam flowing between cathode 2 and collector 6. A change in velocity of the beam produces a corresponding shift in phase in the signal coupled out of catcher resonator 5. Inasmuch as the electron velocity is continuously varied by the alternating signal component of waveform A, a continuous rate of change of phase of the output signal is produced. In other words, the output signal is frequency modulated by waveform A.

Ordinarily, the frequency modulation of the output signal of klystron 1 is of no particular concern. In certain applications, however, such spurious frequency excursion cannot be tolerated. For example, in the case of the object detection system disclosed in U.S. Patent 2,624,876, issued on January 6, 1953, in the name of R. H. Dicke, the frequency content of an output amplified signal is of fundamental importance in the operation of the detection system. In Dicke, the pulsed transmitted signal is frequency modulated in a particular and predetermined manner. Additionally, the pulsed transmitted signal is of relatively low amplitude and of long duration.

Upon reflection of the transmitted signal by a remote object, the frequency content of the transmitted signal is preserved. A special signal filter, included in the receiver of the Dicke system, is designed in accordance with the predetermined knowledge of the frequency content of the reflected signal so as to compress the reflected signal into a relatively high amplitude pulse of short duration. Such an object detection system is commonly termed a pulse compression radar system.

Naturally, the performance of the compression filter embodied in the radar receiver is adversely affected by any uncontrolled frequency excursion of the transmitted signal. Therefore, it is important that no frequency modulation be introduced into the transmitted signal as a by-product of the gating of the transmitter power amplifier. The present invention is particularly suited to the elimination of such frequency modulation.

Returning to FIG. 1, klystron 1 may be employed as the pulsed power amplifier of a pulse compression radar transmitter. Feedback means including windings 13 and 14 of transformer 10 are provided for the elimination of the unwanted frequency modulation that would otherwise appear in the output signal of klystron 1.

Beam forming electrodes 15 and 16 of traveling wave tube 17 are energized by the serially connected winding 14 and power supply 18. A source of input signal which may be frequency modulated in a desired predetermined manner is generally represented by the numeral 19. The output signal of generator 19 is applied to the input terminal of helix 20 of traveling wave tube 17. The output terminal of helix 20 is coupled by means of line 7 to the input resonator 4 of klystron 1.

In an illustrative case, the output signal of source 19 may be linearly frequency modulated as shown in curve B of FIG. 2 which is a plot of frequency versus time. The linearly modulated signal is amplified in tube 17 and applied to the input cavity of klystron 1. The amplified signal extracted from output cavity 5 of klystron 1, however, in the absence of the feedback means including windings 13 and 14 of transformer 10, would be frequency modulated as shown by solid line curve C of FIG. 2. The ripple component in the frequency versus time plot of curve C is produced by the corresponding ripple component of waveform A which is applied to the electron gun of klystron 1. The pulse including the ripple component of waveform A is coupled by power supply 18 and windings 13 and 14 of transformer 10 to the beam forming electrodes of traveling wave tube 17. Windings 13 and 14 are poled so as to invert the ripple induced in winding 11 prior to application to the beam forming electrodes of tube 17. The inverted ripple component applied to tube 17 frequency modulates the output signal of source 19 as represented by the dotted curve C.

By inspection of curve C of FIG. 2, it will be seen that solid line ripple component which tends to be introduced in klystron 1 is cancelled out by the dotted line ripple component which is introduced in traveling wave tube 17. The net effect on the signal on output line 8 of klystron 1 is that it is modulated solely by the desired frequency characteristic illustrated in curve B of FIG. 2.

From the preceding specification, it will be seen that the objects of the present invention have been achieved in a preferred embodiment by the provision of first and second velocity modulation amplifying devices connected in cascade. One of the amplifiers is gated on and off by a pulse signal containing inherent undesirable alternating signal components. The alternating signal components are obtained from the pulse modulating signal and applied to the other amplifier in such a sense so as to introduce in the signal passed by said other amplifier frequency modulation which is opposed to the frequency modulation introduced in said one amplifier. By cascading the two amplifiers the desired input signal finally emerges from the output of the second amplifier with substantially no undesirable frequency modulation.

Although in the embodiment of the present invention shown in FIG. 1 only one velocity modulation amplifier 1 is gated on and off and only one additional velocity modulation amplifier 17 is employed to cancel the undesired frequency modulation distortion produced in amplifier 1, it will be recognized that the invention is readily applicable where a plurality of amplifiers are gated and where a plurality of additional amplifiers are used for compensation. For example, two velocity modulation amplifiers may be gated on and off and at least one additional velocity modulation amplifier may be used to cancel the velocity modulation distortion produced in the two gated amplifiers.

It should also be noted that while current (transformer) feedback of the undesired ripple component is shown in FIG. 1, voltage feedback or combinations of current and voltage feedback may be employed in the application of the ripple component to the compensating velocity modulation amplifier.

While the invention has been described in its preferred embodiments, it is to be understood that the words which have been used are words of description rather than of limitation and that changes within the purview of the appended claims may be made without departing from the true scope and spirit of the invention in its broader aspects.

What is claimed is:

1. In combination, at least one velocity modulation amplifier and at least one additional amplifier capable of frequency modulating a desired signal in response to a control signal, said velocity modulation and said additional amplifiers being connected in cascade for amplifying said desired signal, each said velocity modulation amplifier being adapted to receive a pulse modulating signal for gating each said velocity modulation amplifier on and off, means for generating said pulse modulating signal and for applying said modulating signal to each said velocity modulation amplifier, said modulating signal containing an undesired ripple component causing non-uniformity in the amplitude thereof, means for developing a compensating signal having substantially the same wave shape as that of said undesired ripple component, and means for applying said compensating signal as said control signal to each said additional amplifier whereby to produce therein frequency modulation of said desired signal opposite in sense to the frequency modulation produced in each said velocity modulation amplifier by the ripple component of the pulse modulating signal.

2. In combination, means for frequency modulating a desired input signal in response to a control signal, velocity modulation amplifying means connected to receive and operative to amplify the frequency modulated output signal of said means for frequency modulating, said velocity modulation amplifying means being adapted to receive a pulse modulating signal for gating said velocity modulation amplifying means on and off, means for generating said modulating signal and for applying said modulating signal to said velocity modulation amplifying means, said modulating signal containing an undesired ripple component giving rise to non-uniformity in the amplitude thereof, means for developing a compensating signal having substantially the same wave shape as that of said undesired ripple component, and means for applying said compensating signal as said control signal to said means for frequency modulating to produce therein frequency modulation of said desired input signal opposite in sense to the frequency modulation produced in said velocity modulation amplifying means by the ripple component of the pulse modulating signal.

3. In combination, first and second velocity modulation amplifiers connected in cascade for amplifying a desired signal, one of said amplifiers being adapted to receive a pulse modulating signal for gating said one amplifier on and off, means for generating said pulse modulating signal and for applying said modulating signal to said one of said amplifiers, said modulating signal containing an undesired ripple component giving rise to non-uniformity in the amplitude thereof, means for obtaining said ripple component from said modulating signal, and means for applying the obtained ripple component to the other of said amplifiers whereby to produce therein frequency modulation of said desired signal opposite in sense to the frequency modulation produced in said one of said amplifiers by the pulse modulating signal.

4. Means for cancelling frequency modulation distortion in a gated velocity modulation amplifier comprising a pair of velocity modulation amplifiers for the successive serial amplification of a desired input signal, means for generating a gating signal, said gating signal containing an undesired ripple component causing non-linearity in the amplitude thereof, means for applying said gating signal to one of said amplifiers for gating said one amplifier on and off, the other of said amplifiers having beam forming electrodes, means for obtaining said ripple component from said gating signal, and means for applying the obtained ripple component to said beam forming electrodes of said other of said amplifiers in a sense opposite to the sense of the ripple component as applied to said one of said amplifiers.

5. In combination, first and second velocity modulation amplifiers connected in cascade for amplifying a desired input signal, means for generating said desired signal and applying said desired signal to one of said amplifiers, means for generating a pulse modulating signal and for applying said modulating signal to the other of said amplifiers, said modulating signal containing an undesired signal component producing non-uniformity in the amplitude of said modulating signal, means for obtaining said undesired signal component from said modulating signal and for applying the obtained signal component to said one of said amplifiers whereby said undesired signal component produces in said one amplifier frequency modulation of said desired signal in a sense opposite to that produced in said other of said amplifiers by said modulating signal.

6. Means for suppressing undesirable frequency modulation produced in a gated klystron amplifier, said means comprising a klystron amplifier and a traveling wave amplifier connected in cascade, said klystron amplifier having an electron gun including an anode and a cathode, said traveling wave amplifier having beam forming electrodes and being adapted to receive a desired input signal to be amplified, means for generating a pulse modulating signal, said modulating signal containing an undesired signal component giving rise to non-uniformity in the amplitude thereof, means for applying said modulating signal across said anode and cathode of said electron gun of said klystron amplifier, means for coupling said modulating signal to said beam forming electrodes of said traveling wave amplifier, said means for coupling including means for phase shifting said undesired signal component whereby said undesired signal component produces frequency modulation in the desired signal passed by said traveling wave amplifier in a sense opposite to that of the frequency modulation of said desired signal produced in said klystron by said modulating signal.

References Cited in the file of this patent

UNITED STATES PATENTS

| | | |
|---|---|---|
| 2,409,608 | Anderson | Oct. 22, 1946 |
| 2,436,066 | Favre | Feb. 17, 1948 |